(12) United States Patent
Janesick

(10) Patent No.: US 9,287,319 B2
(45) Date of Patent: Mar. 15, 2016

(54) CMOS MULTI-PINNED (MP) PIXEL

(71) Applicant: SRI International, Menlo Park, NJ (US)

(72) Inventor: James Robert Janesick, Huntington Beach, CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 14/071,150

(22) Filed: Nov. 4, 2013

(65) Prior Publication Data

US 2014/0138748 A1    May 22, 2014

Related U.S. Application Data

(60) Provisional application No. 61/727,537, filed on Nov. 16, 2012.

(51) Int. Cl.
*H01L 27/146* (2006.01)
*H01L 27/148* (2006.01)

(52) U.S. Cl.
CPC ...... *H01L 27/14887* (2013.01); *H01L 27/1461* (2013.01); *H01L 27/1463* (2013.01); *H01L 27/14612* (2013.01); *H01L 27/14645* (2013.01); *H01L 27/14656* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 5,070,380 A | 12/1991 | Erhardt et al. | |
| 5,625,210 A | 4/1997 | Lee et al. | |
| 6,100,556 A * | 8/2000 | Drowley et al. | 257/292 |
| 6,566,697 B1 * | 5/2003 | Fox et al. | 257/292 |
| 6,630,701 B1 | 10/2003 | Rhodes | |
| 7,408,211 B2 | 8/2008 | Kao | |
| 7,498,584 B2 * | 3/2009 | Moody et al. | 250/370.09 |
| 8,723,284 B1 * | 5/2014 | Hynecek | H01L 31/103 257/228 |
| 2004/0041150 A1 | 3/2004 | Jang et al. | |
| 2004/0188727 A1 * | 9/2004 | Patrick | 257/292 |
| 2006/0108618 A1 * | 5/2006 | Ahn et al. | 257/292 |
| 2006/0146158 A1 * | 7/2006 | Toros | H01L 27/14603 348/308 |
| 2007/0296006 A1 * | 12/2007 | Adkisson et al. | 257/292 |
| 2011/0068382 A1 | 3/2011 | Lauxtermann | |
| 2012/0056079 A1 | 3/2012 | Levine et al. | |
| 2013/0092982 A1 * | 4/2013 | Chen et al. | 257/223 |

FOREIGN PATENT DOCUMENTS

| | | | |
|---|---|---|---|
| KR | 2008-0058665 A | 6/2008 | |
| KR | 2011-0078558 A | 7/2011 | |

OTHER PUBLICATIONS

International Search Report and Written Opinion mailed Feb. 28, 2014 for Application No. PCT/US2013/069969, 13 pages.

* cited by examiner

*Primary Examiner* — Johannes P Mondt
(74) *Attorney, Agent, or Firm* — Moser Taboada

(57) ABSTRACT

A CMOS multi-pinned pixel having very low dark current and very high charge transfer performance over that of conventional CMOS pixels is disclosed. The CMOS pixel includes epitaxial silicon and at least one transfer gate formed upon the epitaxial silicon. A pinned-photodiode is formed in the epitaxial silicon. A multi-pinned (MP) implant layer is implanted in the epitaxial silicon at least partially extending across the pinned-photodiode and substantially underlying the at least one transfer gate of the CMOS pixel to promote dark current passivation during an accumulation state and promote charge transfer during a transfer state.

29 Claims, 12 Drawing Sheets

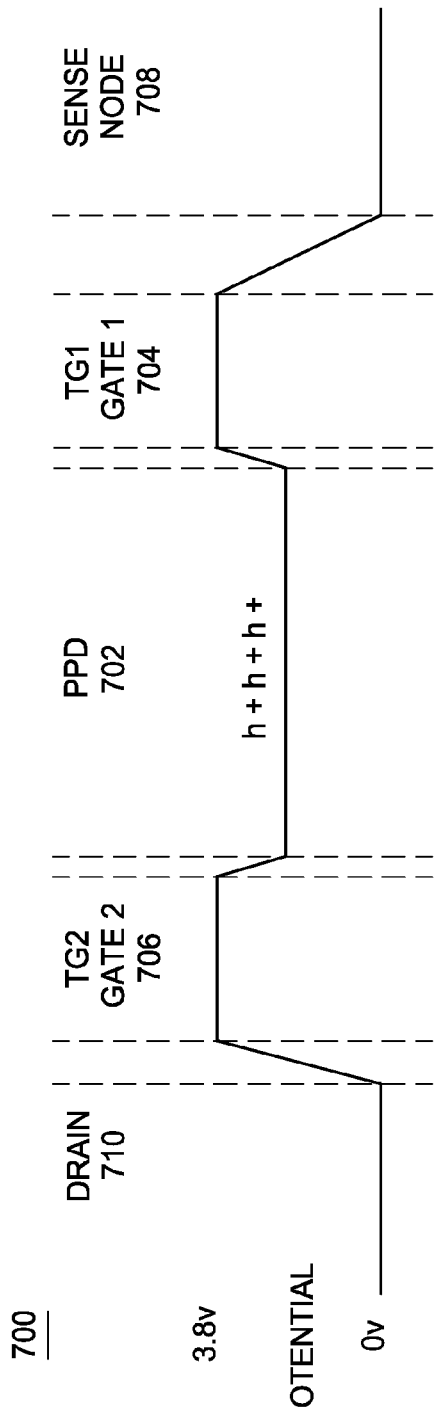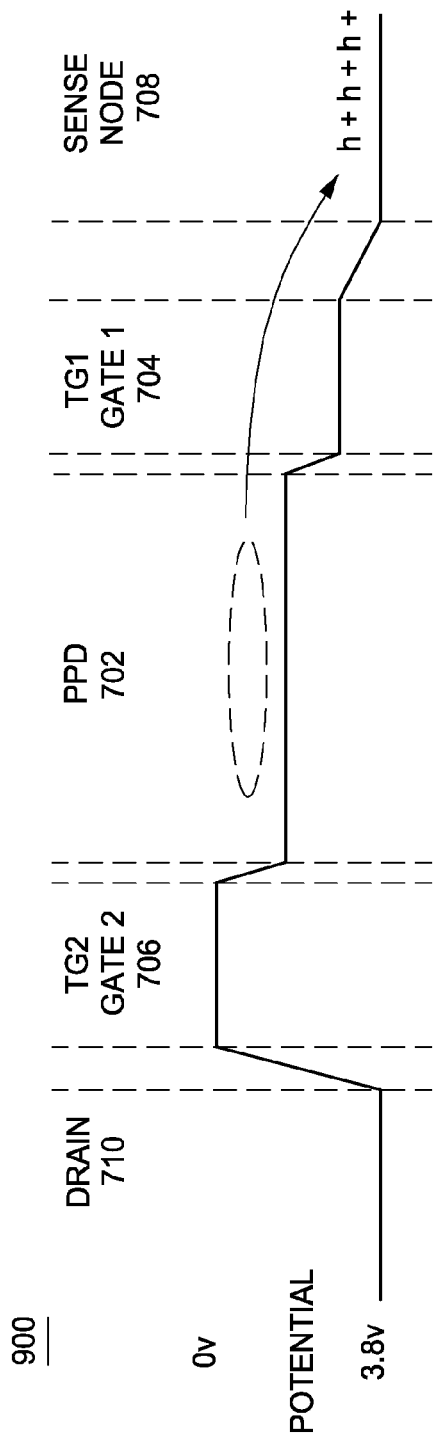

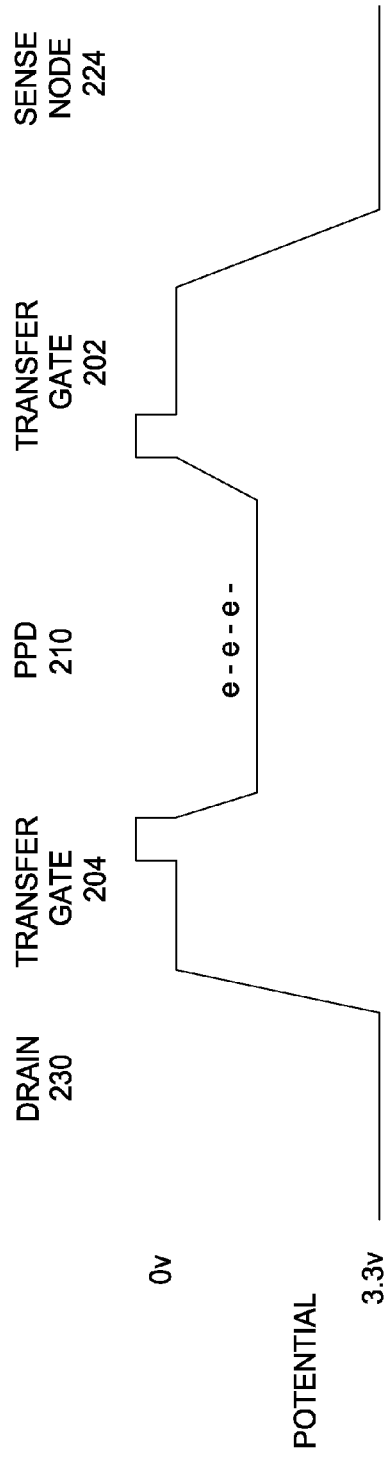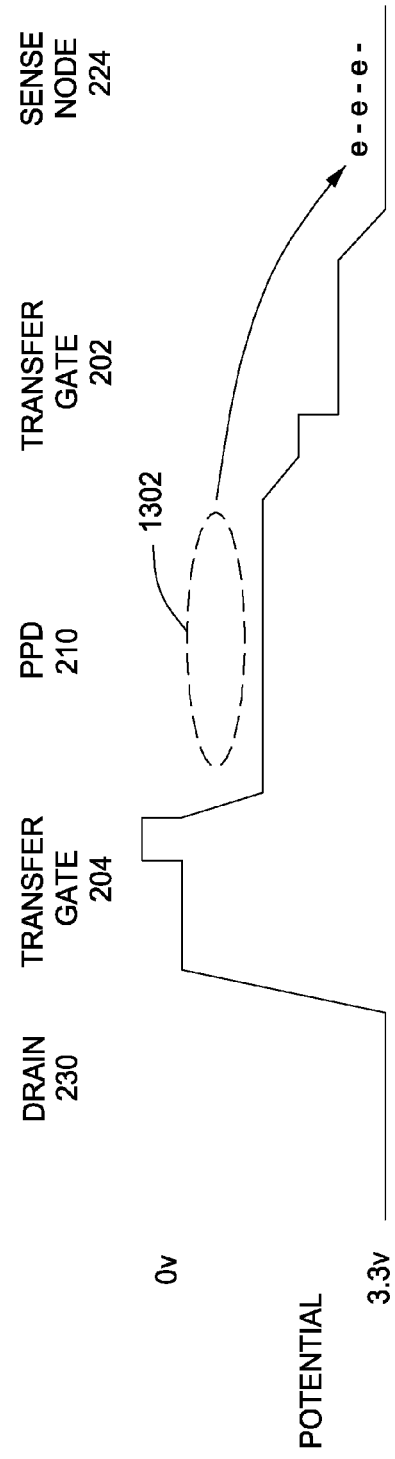

CMOS MULTI-PINNED (MP) PIXEL

CROSS-REFERENCE TO RELATED APPLICATIONS

This application claims benefit of U.S. Provisional Patent Application Ser. No. 61/727,537, filed Nov. 16, 2012, which is herein incorporated by reference.

FIELD OF THE INVENTION

Embodiments of the present invention are generally related to pixel technology for CMOS imaging sensors and, more particularly, to a CMOS multi-pinned (MP) pixel.

BACKGROUND OF THE INVENTION

A popular CMOS pixel used in scientific imagers is a so-called 5T (i.e., a 5 transistor) pinned-photodiode pixel (herein after a "5TPPD pixel"). FIG. 1 depicts a schematic view of a conventional NMOS 5TPPD pixel 100. The 5TPPD pixel 100 includes a pinned-photo diode (PPD) 102 as a photosensitive element for photo generating and collecting electrical charge. The PPD 102 is flanked by transfer gate-1 (TG1) 104 and transfer gate-2 (TG2) 106. A sense node 108 is located proximate the TG1 104 and converts charge to a voltage. The sense node 108 is coupled to three 'read' MOSFETs 120, 122, 124. These MOSFETS are known as the reset, source follower and row select transistors, respectively. Collectively, they are responsible for reading a video voltage level on the sense node 108.

More specifically, the PPD 102 comprises a diode 126 (n-doped for a NMOS 5TPPD pixel) formed within p-epitaxial silicon 128. The p-epi silicon 128 resides above a highly doped p-substrate 130. During operation of the pixel the p-epi silicon 128 and substrate 130 are assumed to be at ground potential (i.e., zero volts) or an external negative bias potential. A p-doped pinning layer 132 is formed directly above and aligned with the diode 126. The pinning layer 132 assumes the same potential as the substrate, whereas the doping of the diode 126 sets a potential for the PPD 102. A p-well 134 surrounds the PPD 102, the transfer gates 104 and 106, and the sense node 108. The read MOSFETS 120, 122 and 124 as well as additional support circuitry are formed in the p-well 134.

In operation, charge on the sense node 108 is first removed by the reset MOSFET 120 coupled to the $V_{REF}$ potential 136. During charge collection, TG2 106 is "off" (i.e., decoupling the $V_{REF}$ potential 136 from the diode 126) and the TG1 104 is "off" (i.e., decoupling the sense node 108 from the PPD 102). In some implementations, the gate TG2 106 is not present. As photons interact with the PPD 102, electrons are generated and collected in the diode 126 over the time period of exposure. After exposure, TG1 104 is turned "on" to transfer signal charge from the diode 126 to the sense node 108. The electrons present on the sense node 108 are converted to a voltage (by the capacitance related to the sense node 108). This resultant voltage is buffered by the source follower MOSFET 122 and output as a pixel value when the pixel row is selected by MOSFET 124. Once the pixel value is present at the column video output, the PPD 102 and sense node 108 are reset and the imaging process repeats.

The foregoing describes the structure and operation of an NMOS 5TPPD pixel. For a PMOS 5TPPD pixel, the n and p doping is reversed (p becomes n, and n becomes p), the p-well becomes an n-well and the voltages $V_{REF}$, $V_{DD}$ are set to 0 volts and the substrate is biased at 3.3 volts. In a PMOS 5TPPD pixel, the carriers are holes rather than electrons.

Although thermally generated dark current is very low for the PPD 102, a significant amount of dark charge originates from the transfer gates 104 and 106 (typically 2-3 orders of magnitude higher than the PPD generated dark current). When attempting to measure extremely low signal levels, e.g., 10 electrons per the exposure and read periods, the level of dark current can obscure the signal level measured. In addition, charge trapping and recombination effects that are very common to transfer gates 104 and 106 can reduce the measured signal level. Prior attempts at improving these issues has impacted the charge transfer efficiency (CTE) of the pixel.

Therefore, there is a need in the art for an improved 5TPPD pixel having low dark current, while maintaining high CTE without trapping and recombination problems.

SUMMARY OF THE INVENTION

A CMOS multi-pinned pixel and a method of manufacturing a CMOS multi-pinned pixel substantially as shown in and/or described in connection with at least one of the figures, as set forth more completely in the claims.

Various features and advantages of the present disclosure may be appreciated from review of the following detailed description of the present disclosure, along with the accompanying figures in which like reference numerals refer to like parts throughout.

BRIEF DESCRIPTION OF THE DRAWINGS

Embodiments of the present invention may be more readily understood from the detailed description of an exemplary embodiment presented below considered in conjunction with the attached drawings and in which like reference numerals refer to similar elements and in which:

FIG. 7 is a representation of potential conditions when signal charge collects in the PPD for the PMOS MP pixel of FIG. 18;

FIG. 9 shows potential conditions when charge is transferred for the PMOS MP pixel of FIG. 18;

FIG. 12 illustrates a potential plot for a NMOS MP pixel with a TG barrier implant shown in FIG. 11 when signal charge collects in the PPD region;

FIG. 13 illustrates a potential plot for a NMOS MP pixel with a TG barrier implant shown in FIG. 11 operating in charge transfer mode;

It is to be understood that the attached drawings are for purposes of illustrating the concepts of the invention and may not be to scale.

DETAILED DESCRIPTION OF THE INVENTION

Embodiments of the present invention comprise an improved 5TPPD pixel having a multi-pinned (MP) pixel architecture. The improvement arises from placing an MP implant into the PPD region along with the diode and pinning implants, as well as extending the MP implant layer at least through at least one transfer gate region (TG1 and/or TG2). However, satisfactory performance is achieved when the entire 5TPPD pixel is uniformly implanted with the MP implant. In fact, the entire silicon wafer can be globally implanted as the first step in the fabrication process. The use of a MP implant layer is compatible with other known 5TPPD techniques such as drain and sense node shielding, additional PPD barrier layers, implants for improving channel coupling from the transfer gate to the sense node and the like. The alternatives will be discussed below.

Figure 1:
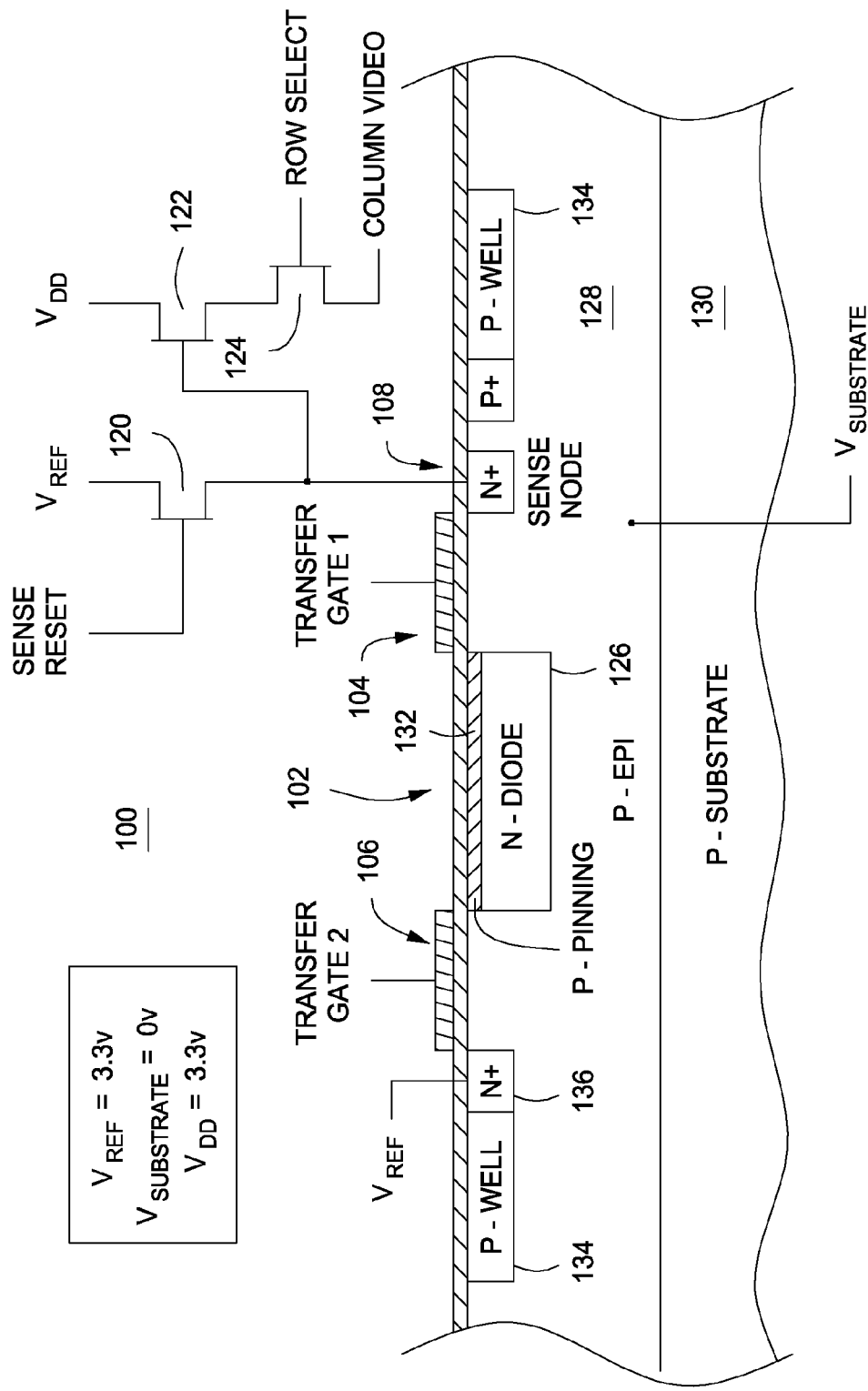
FIG. 1 is a cross-sectional view of a background art 5T (i.e., a 5 transistor) n-type CMOS pinned-photo diode pixel.
Figure 2:
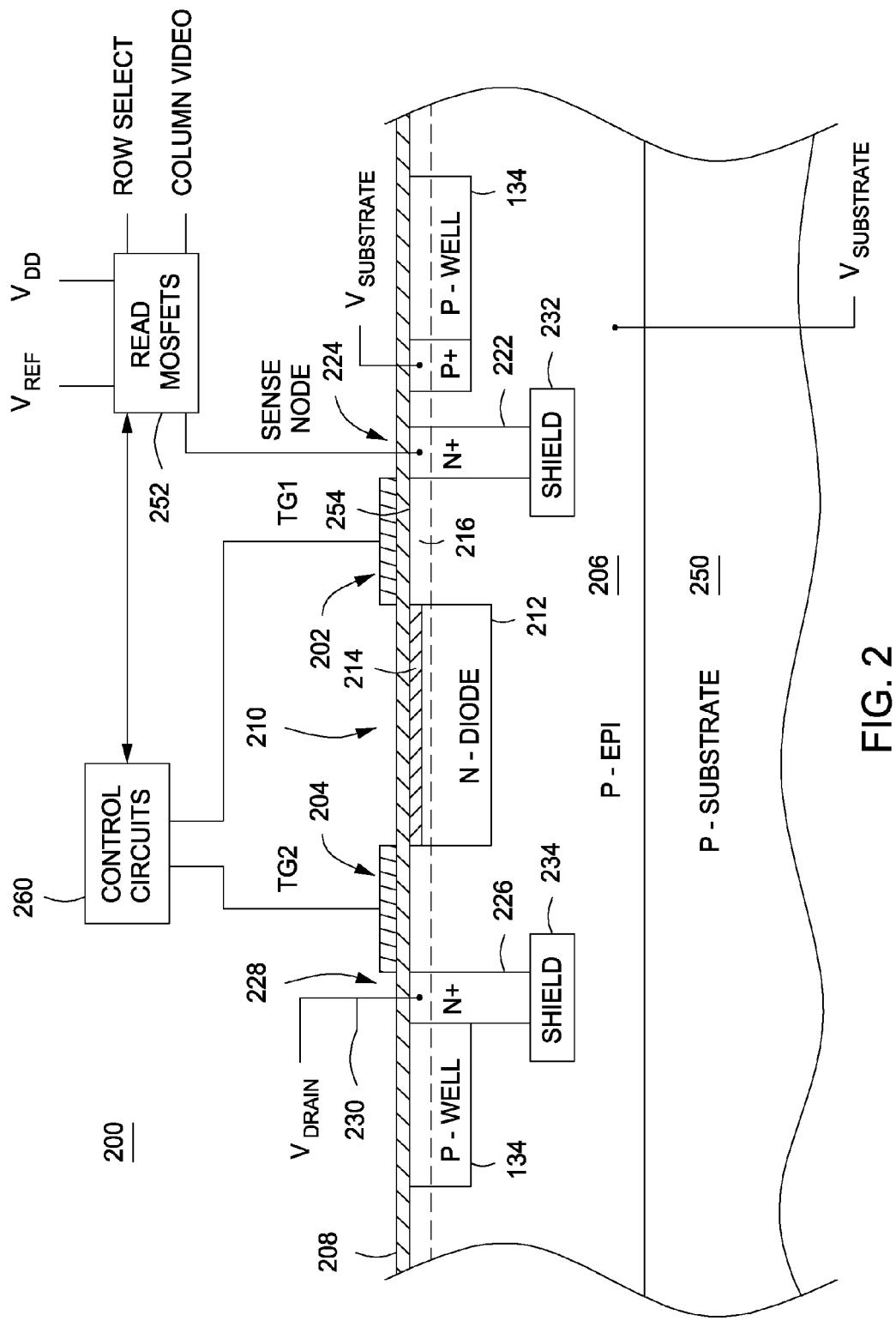
FIG. 2 is a cross-sectional view of an NMOS multi-pinned (MP) pixel according to an embodiment of the present invention.

FIG. 2 is a simplified cross-sectional view of an n-type CMOS (NMOS) MP pixel 200 operable to have a very low dark current, according to an embodiment of the present invention. The NMOS MP 5TPPD pixel 200 includes a first transfer gate (TG1) 202 and, optionally, a second transfer gate (TG2) 204 formed upon epitaxial silicon 206 (e.g., p_epi or p_SOI). The epitaxial silicon 206 resides upon a highly doped substrate 250 (e.g., p-substrate). The NMOS MP pixel 200 includes a layer 208 of insulating material that may be, for example, an oxide of silicon (e.g., $SiO_2$) that overlies the epitaxial silicon 206 and underlies the first transfer gate 202 and the second transfer gate 204. The gates 204 and 202 are typically fabricated from polysilicon. A sense node contact implant 222 (e.g., n_phosphorus) forms the sense node 224. The sense node 224 is coupled to the "read" MOSFETS 252. A drain contact implant 226 (e.g., n_phosphorus) forms a drain region 228 coupled to a surface drain contact 230. A pinned-photodiode (PPD) 210 is formed in the epitaxial silicon 206 between the gates 202 and 204. The PPD 210 comprises a diode 212 (e.g., n_phosphorus), a pinning layer 214 (e.g., p_boron) and a portion (dashed line) of an MP implant layer 216 (e.g., n_arsenic or n_phosphorus). In an embodiment, the MP implant layer 216 can entirely cover NMOS MP pixel 200 extending about 450 Å below the surface 254 of the epitaxial silicon 206. The MP implant 216 slightly alters the the potential of the PPD 210. The dashed line within the PPD 210 is intended to indicate the blending of the pinning layer 214 and the MP implant layer 216.

During the charge collection exposure time period, a control circuit 260 shown in FIG. 2A negatively biases the transfer gates (TG1 and TG2) creating a very shallow, but highly concentrated, inversion layer of holes at the epitaxial to oxide (e.g., Si—$SiO_2$) interface which come from the p-well 134 and p_substrate regions 250. The holes prevent the potential under the gates 202 and 204 from dropping no further than the substrate potential no matter how much additional negative bias is applied. As such, the transfer gates 202 and 204 are 'pinned' to substrate potential (0V) when this happens. This special condition typically takes place when the gates 202 and 204 are negatively biased to −0.5 to −1.0V. The holes provided in this manner recombine with thermal dark current electrons generated by the gates thus passivating the Si—$SiO_2$ region.

After the charge collection period the first transfer gate (TG1) 202 is positively clocked (TG2 204 always assumes the pinned state). This, in turn, causes signal electrons to move from the PPD 210 to the sense node 224. The MP implant layer 216 under the gate 202 helps this process by creating a 'buried channel' that allows signal electrons to efficiently transfer to the sense node 224 deep in the silicon without Si—$SiO_2$ interface interaction and without recombining with remnant trapped holes still present at the surface of the gate TG1 202 after inversion. As such, the MP implant 216 simultaneously yields ultra-low dark current performance (usually limited by dark current generated in the PPD region) while also achieving near perfect charge transfer efficiency without trapping and recombination issues commonly related to the transfer gate 202. The pixel 200 as a whole is referred to as being 'multi-pinned' (MP), i.e., pinned at the photodiode 210 by the PPD pinning layer 214 and pinned at the transfer gates 202 and 204 by the MP implant 216. A more detailed pictorial description of the charge collection and transfer states is provided with respect to FIGS. 3, 4, 5 and 6 for a MP NMOS pixel (to be more fully discussed below).

In an embodiment, the NMOS MP pixel 200 may include a deep implant 232 (e.g., p_boron) underlying (i.e., beneath) the sense node 224. This deep implant 232 forms a shield that prevent carriers from reaching the sense node 224 that are generated deep within the sepitaxial silicon 206. Optionally, a similar second deep implant 234 (e.g., p_boron) may be formed underlying (i.e., beneath) the drain region 228 to shield the drain node 230 from carriers generated deep within the epitaxial silicon 206.

In one embodiment of the invention, the MP pixel 200 is fabricated by incorporating the MP implant followed by the PPD pixel fabrication process. The energy and dose of the MP implant are relatively low compared to other implants that the wafer receives. Specifically for a PMOS imager the dose is approximately 1e12 ions/$cm^2$ BF2 at an energy of 20 keV producing an implant depth of 750 A. For a NMOS imager the dose is about 1e12 ions/$cm^2$ P with an energy of 30 keV producing an implant depth of 450 A.

Note that the energy level for the MP implant, whether NMOS or PMOS, is relatively low so as to not disturb the PPD potential. Using a high energy implant could mix with the diode implant and result in a lower PPD potential, which would reduce the charge capacity of the pixel. The MP and the PPD pinning layers are implanted using similar energy levels, but their dose is over an order of magnitude different. As such, the mixing of the MP and the PPD pinning layers takes place. However, this combination only causes a slight change in the diode potential and maintains the pinning function (i.e., the surface of the diode is firmly held at substrate potential). The MP dose is also sufficiently adjusted to ensure that the signal carriers are kept from the surface beneath the transfer gates to circumvent surface trapping and recombination, while having the dose low enough to not significantly influence full well performance defined by the diode implant. The fabrication process represents, in a very simplistic manner, only one way of fabrication. From the description herein, those skilled in the art may utilize other processes for fabricating NMOS or PMOS multi-pinned pixel.

Figure 3:
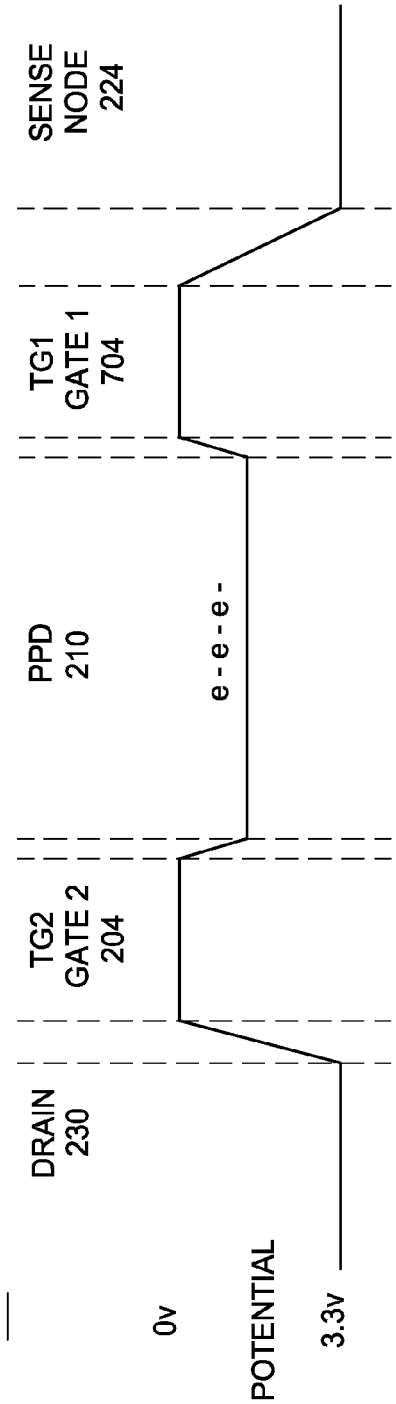
FIG. 3 is a representation of potential conditions when signal charge collects in the PPD for the NMOS MP pixel of FIG. 2.
Figure 4:
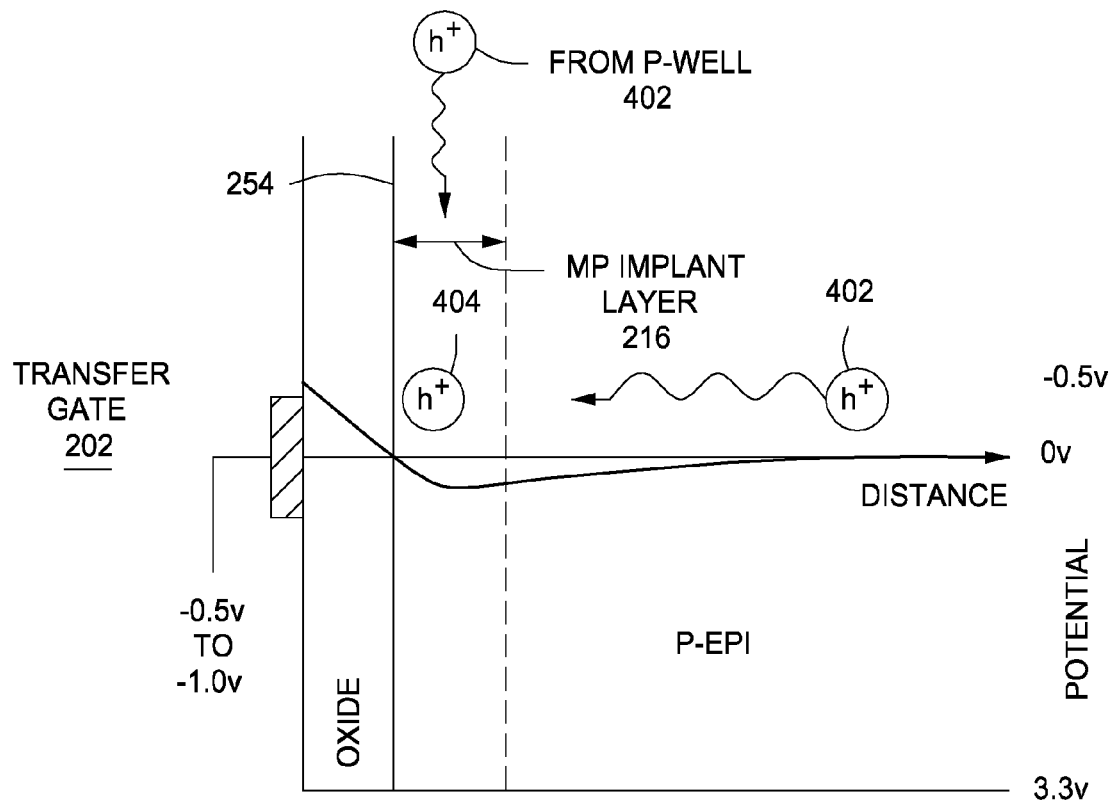
FIG. 4 is a representation of transfer gate (TG) potential in a NMOS MP pixel as a function of distance into the epitaxial silicon when signal charge collects in the PPD region. During this time, holes 'invert' the channel under TG1 and TG2 at the epitaxial silicon to oxide interface.

FIG. 3 is a representation of potential conditions during the exposure time when signal electrons collect in the pinned-photodiode 210 for the NMOS MP pixel 200 of FIG. 2. FIG. 4 is a companion drawing to FIG. 3 showing the transfer gate potential as a function of distance into the epitaxial silicon. Note the transfer gates 202, 204 are inverted and pinned to substrate potential by holes (h+) 402 supplied from the p-well and epitaxial silicon 206 that move under the surface 254 beneath the gate. The sense node 224 and the drain region 126 are held at +3.3 volts during this time. As photons impinge on the PPD 210, signal electrons collect in the PPD 210 causing the potential of the PPD 210 to "fall" towards substrate potential (0V) until full well is reached.

Figure 5:
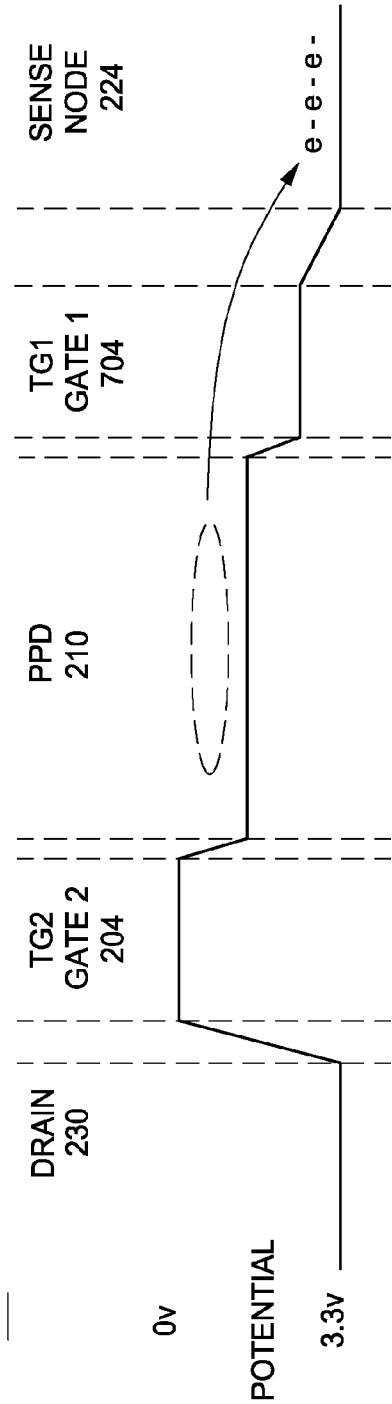
FIG. 5 shows potential conditions when charge is transferred for the NMOS CMOS MP pixel of FIG. 2.
Figure 6:
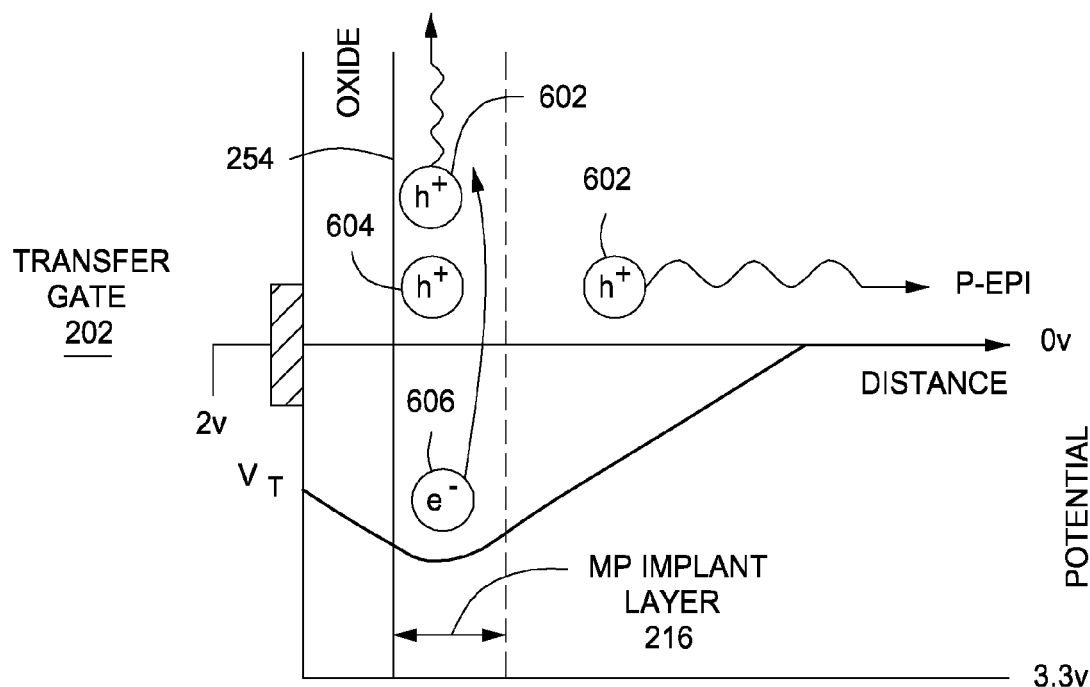
FIG. 6 is a representation of transfer gate (TG) potential in a NMOS MP pixel as a function of distance into the epitaxial silicon when signal charge transfers from the PPD region. During this time holes under the TG1 diffuse back to the p-substrate.

FIG. 5 is a representation of potential conditions for the transfer gates 202 and 204 during charge transfer for the NMOS MP pixel 200 of FIG. 2. FIG. 6 supports FIG. 5 showing a representation of the transfer gate potential as a function of distance into the epitaxial silicon. The transfer gate 202 is clocked with a positive voltage (typically to 2.0V for 1 us) to transfer signal electrons "e-" 606 to the sense node 224. This action also releases this transfer gate from the pinned/inverted state by releasing free holes 602 back into the p-epitaxial silicon 206 and the p-well 134. At the same time a very small number of holes 604 remain trapped at the surface 254 beneath the gate 202. The holes will recombine with signal carriers for a non MP pixel as they pass through the transfer gate. However, the buried channel provided by MP implant 216 keeps electrons 606 from the surface. Hence, signal electrons can fully propagate through the transfer gate region without substantial recombination loss or trapping. This action also automatically clears the PPD region 210 of charge, setting the stage for the next exposure.

The foregoing description applies to an n-type CMOS 5TPPD pixel. For a p-type CMOS 5TPPD pixel, the p doped regions are n doped and the n doped regions are p doped. In addition, the voltages for drain and sense node are 0V rather than 3.3V and the epitaxial silicon voltage is biased at 3.3V instead of 0V. The operation of a PMOS 5TPPD MT pixel is substantially similar to the NMOS 5TPPD MP pixel, although holes are collected in the PPD rather than electrons and electrons are used to passivate the dark current instead of holes when the transfer gates are inverted.

Figure 18:
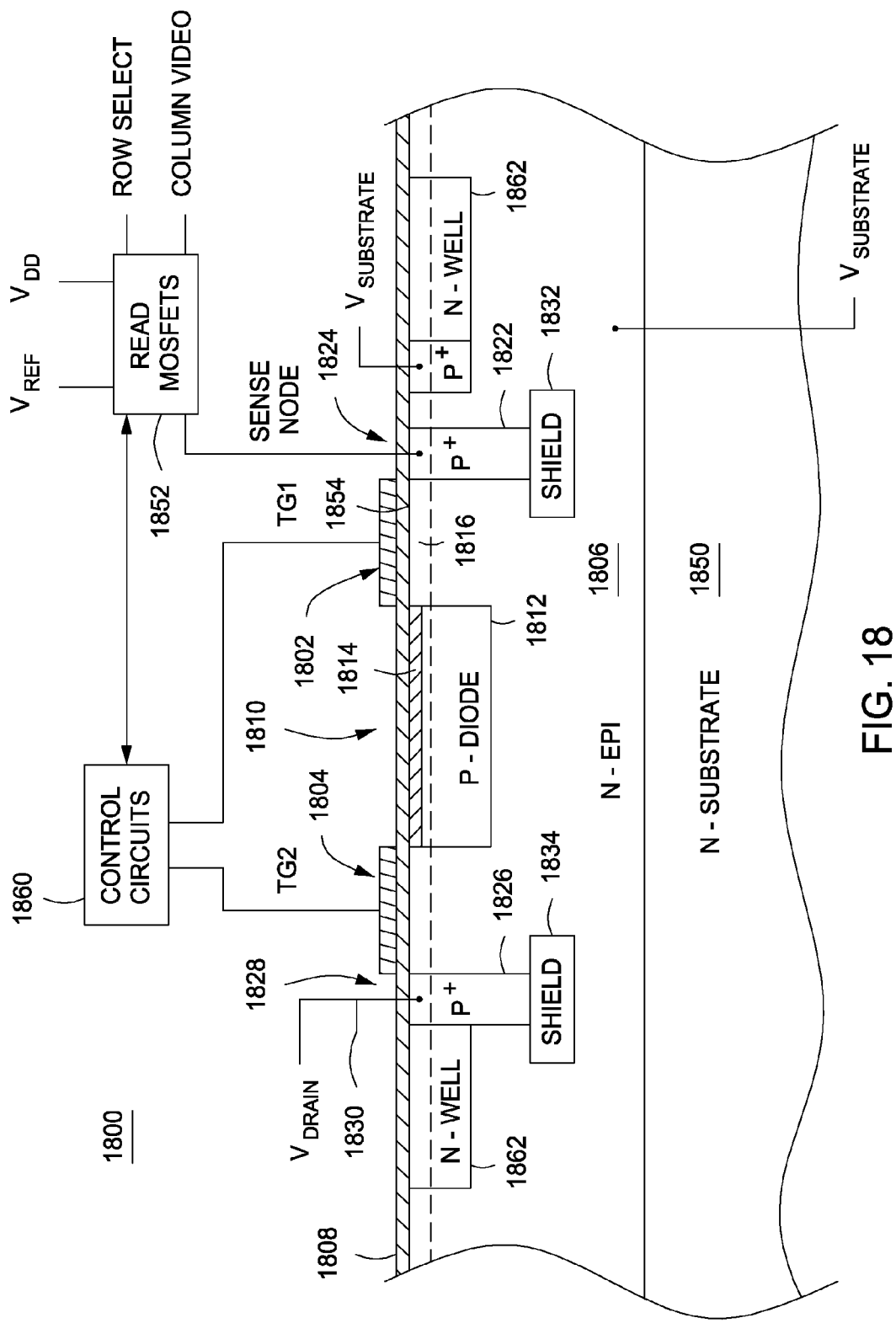
FIG. 18 is a cross-sectional view of a PMOS multi-pinned (MP) pixel according to an embodiment of the present invention.

Specifically, FIG. 18 is a simplified cross-sectional view of a p-type CMOS (PMOS) MP pixel 1800 operable to have a very low dark current, according to an embodiment of the present invention. The PMOS MP 5TPPD pixel 1800 includes a first transfer gate (TG1) 1802 and, optionally, a second transfer gate (TG2) 1804 formed upon epitaxial silicon 1806 (e.g., n_epi or p_SOI). The epitaxial silicon 1806 resides upon a highly doped substrate 1850 (e.g., n-substrate). The PMOS MP pixel 1800 includes a layer 1808 of insulating material that may be, for example, an oxide of silicon (e.g., $SiO_2$) that overlies the epitaxial silicon 1806 and underlies the first transfer gate 1802 and the second transfer gate 1804. The gates 1804 and 1802 are typically fabricated from polysilicon. A sense node contact implant 1822 (e.g., p_boron) forms the sense node 1824. The sense node 1824 is coupled to the "read" MOSFETS 1852. A drain contact implant 1826 (e.g., P_borons) forms a drain region 1828 coupled to a surface drain contact 1830. A pinned-photodiode (PPD) 1810 is formed in the epitaxial silicon 1806 between the gates 1802 and 1804. The PPD 1810 comprises a diode 1812 (e.g., n_phosphorus), a pinning layer 1814 (e.g., n_phosphorus) and a portion (dashed line) of an MP implant layer 1816 (e.g., p_boron). In an embodiment, the MP implant layer 1816 can entirely cover NMOS MP pixel 1800 extending about 450 Å below the surface 1854 of the epitaxial silicon 1806. The MP implant 1816 slightly alters the the potential of the PPD 1810. The dashed line within the PPD 1810 is intended to indicate the blending of the pinning layer 1814 and the MP implant layer 1816.

During the charge collection exposure time period, a control circuit 1860 shown in FIG. 18 positively biases the transfer gates (TG1 and TG2) creating a very shallow, but highly concentrated, inversion layer of electrons at the epitaxial to oxide (e.g., Si—$SiO_2$) interface which come from the n-well 1862 and n_substrate regions 1850. The electrons prevent the potential under the gates 1802 and 1804 from dropping no further than the substrate potential no matter how much additional positive bias is applied. As such, the transfer gates 1802 and 1804 are 'pinned' to substrate potential (3.3V) when this happens. This special condition typically takes place when the gates 1802 and 1804 are negatively biased to −3.3 to 4.0 volts. The electrons provided in this manner recombine with thermal dark current holes generated by the gates thus passivating the Si—$SiO_2$ region.

After the charge collection period the first transfer gate (TG1) 1802 is negatively clocked (TG2 1804 always assumes the pinned state). This, in turn, causes signal holes to move from the PPD 1810 to the sense node 1824. The MP implant layer 1816 under the gate 1802 helps this process by creating a 'buried channel' that allows signal electrons to efficiently transfer to the sense node 1824 deep in the silicon without Si—$SiO_2$ interface interaction and without recombining with remnant trapped electrons still present at the surface of the gate TG1 1802 after inversion. As such, the MP implant 1816 simultaneously yields ultra-low dark current performance (usually limited by dark current generated in the PPD region) while also achieving near perfect charge transfer efficiency without trapping and recombination issues commonly related to the transfer gate 1802. The pixel 1800 as a whole is referred to as being 'multi-pinned' (MP), i.e., pinned at the photodiode 1810 by the PPD pinning layer 1814 and pinned at the transfer gates 1802 and 1804 by the MP implant 1816. A more detailed pictorial description of the charge collection and transfer states is provided with respect to FIGS. 7, 8, 9, and 10 for a MP PMOS pixel (to be more fully discussed below).

In an embodiment, the PMOS MP pixel 1800 may include a deep implant 1832 (e.g., n_phosphorus) underlying (i.e., beneath) the sense node 1824. This deep implant 1832 forms a shield that prevent carriers from reaching the sense node 1824 that are generated deep within the epitaxial silicon 1806. Optionally, a similar second deep implant 1834 (e.g., n_phosphorus) may be formed underlying (i.e., beneath) the drain region 1828 to shield the drain node 1830 from carriers generated deep within the epitaxial silicon 1806.

Figure 8:
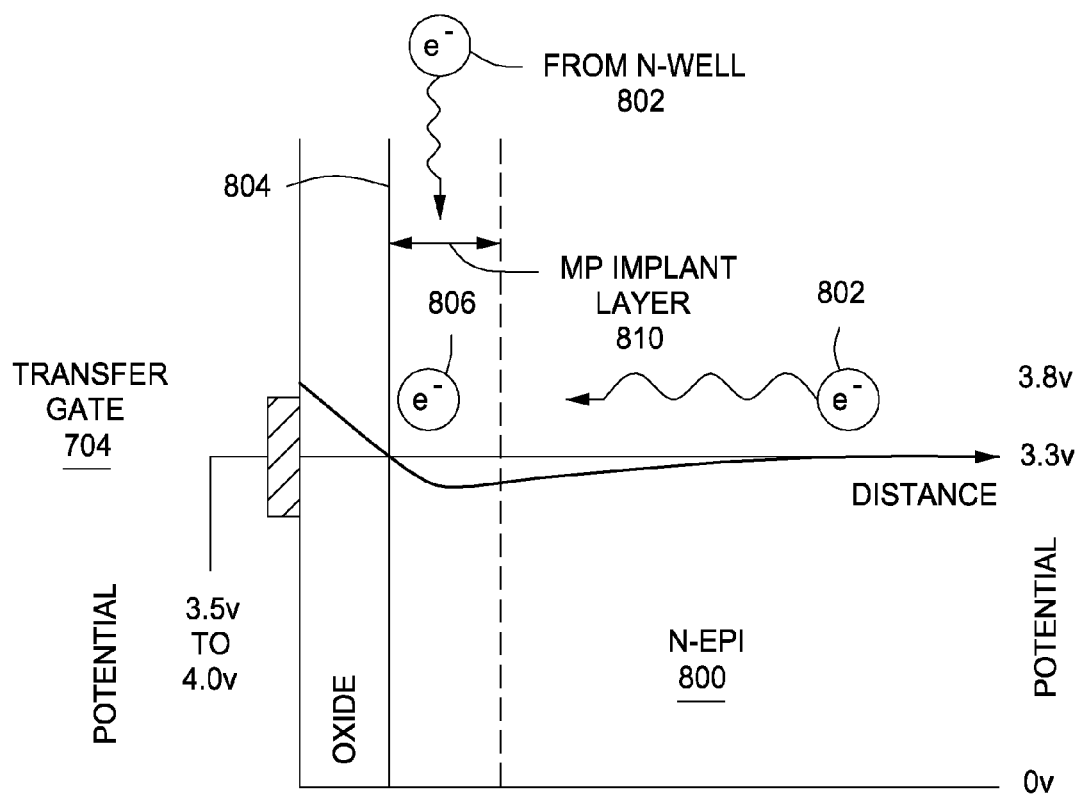
FIG. 8 is a representation of transfer gate (TG) potential in a PMOS MP pixel as a function of distance into the epitaxial silicon when signal charge collects in the PPD region. During this time electrons 'invert' the channel under TG1 and TG2 at the epitaxial silicon to oxide surface.
Figure 10:
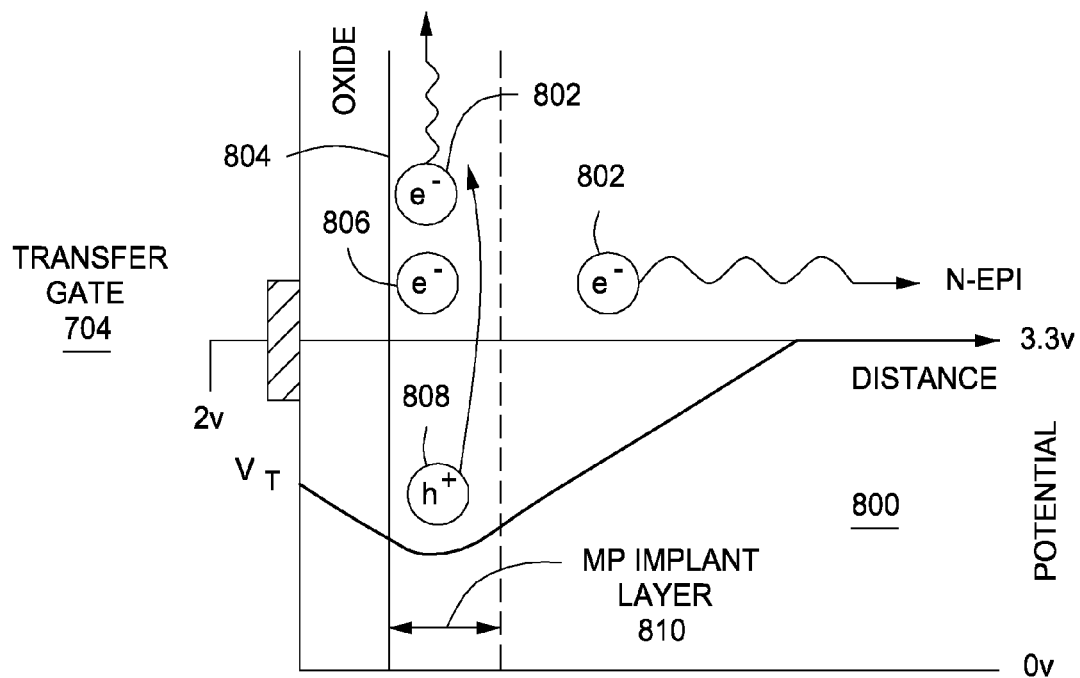
FIG. 10 is a representation of transfer gate (TG) potential in a PMOS MP pixel as a function of distance into the epitaxial silicon when signal charge transfers from the PPD region. During this time electrons under the TG1 diffuse back to the n-substrate.

FIG. 7 is a representation of the potential conditions during the exposure time when signal charge (holes) collect in the pinned-photodiode 702 for the PMOS MP pixel. FIG. 8 is a companion drawing to FIG. 7 representing the transfer gate potential as a function of distance into the epitaxial silicon. The transfer gates 704, 706 are inverted and pinned to substrate potential (3.3 V) by electrons "e-" 806 supplied from the n-well and n-epitaxial silicon 800 that move under the surface 704 beneath the gate. Approximately 3.5 to 4.0 V is applied to the transfer gates for the inverted condition. The sense node 708 and the drain region 710 are held at +0 V during this time. As photons impinge on the PPD 702, signal holes collect in the PPD 210 causing the potential of the PPD 702 to "increase" towards substrate potential (3.3V) at which time full well is reached.

FIG. 9 represents potential voltage conditions for the transfer gates 704 and 706 as a function of distance into the epitaxial silicon during charge transfer for the PMOS MP pixel. The transfer gate 704 is clocked with a positive voltage (typically 2.0V for 1 us) to transfer signal holes "h+" to the sense node 708. This also releases this transfer gate from the pinned/inverted state by releasing free electrons 806 to back into the n-epitaxial silicon 800 and n-well. At the same time, a very small number of electrons 806 remain trapped at the surface 804 beneath the gate 704 which recombine with signal carriers for non MP pixels as they pass through. However, the buried channel potential provided by MP implant layer 810 keeps holes 808 from the surface where the trapped electrons are located. Hence, signal holes can fully propagate through the transfer gate region without substantial recombination loss or trapping. This action also automatically resets the PPD region 702 for the next exposure.

Alternatively, in an embodiment of the invention, the N (or P) MOS pixel may include an additional lightly doped implant (not shown) (e.g., n_phosphorus for NMOS or p_boron for PMOS) to better connect the transfer gates to the sense node or drain regions. The use of such implants to enhance charge transfer is well-known in the art. The use of an MP implant layer to passivate transfer gate dark current without signal recombination loss in accordance with various embodiments of the invention is compatible with such a technique.

Figure 11:
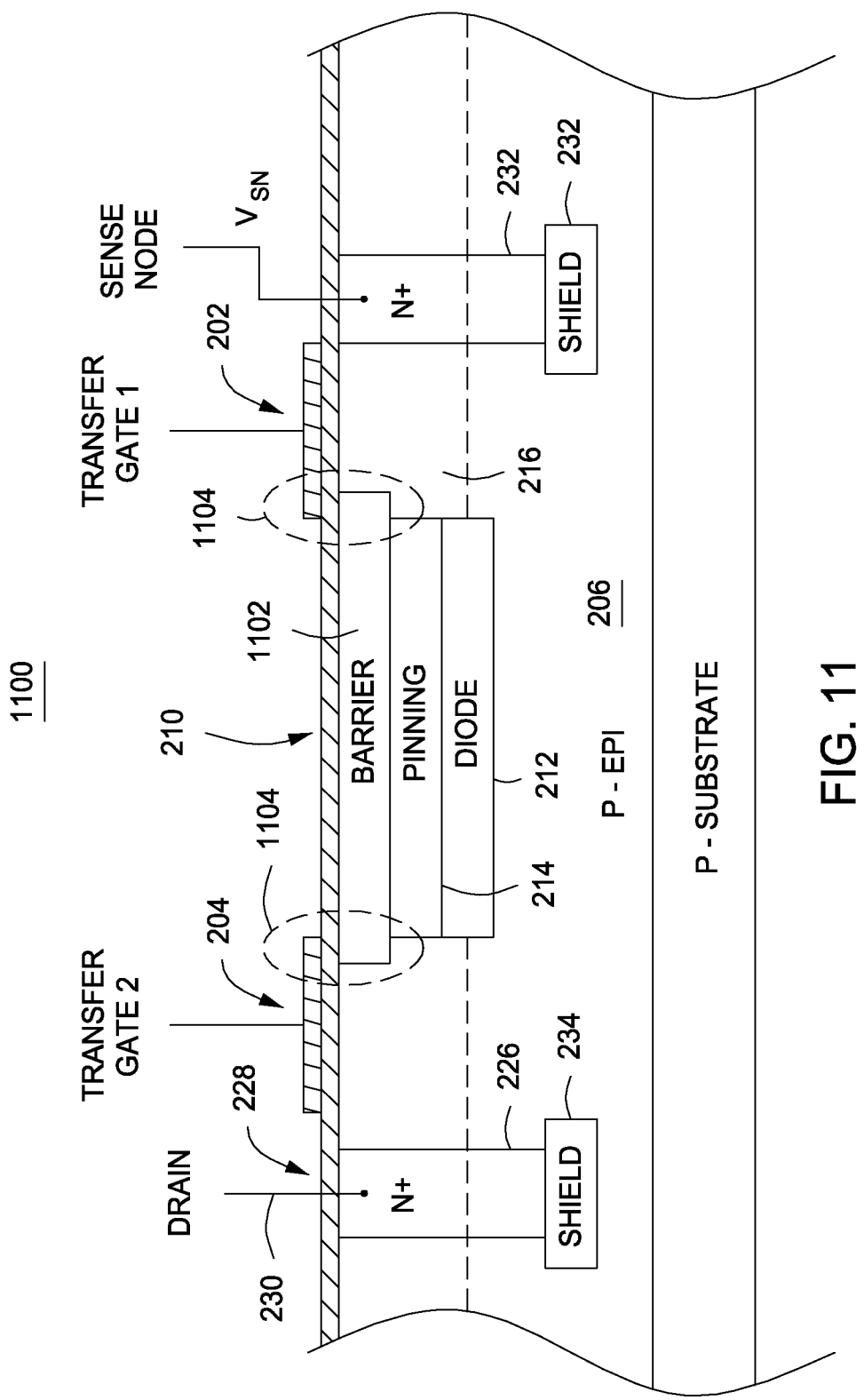
FIG. 11 is a cross-sectional view of NMOS CMOS MP pixel showing two implants often used in CMOS pixels (referred to as the TG barrier and shield implants)

Embodiments of the present invention are subject to numerous variations. FIG. 11 depicts a cross-sectional view of an alternative embodiment of an NMOS MP pixel 1100 comprising a barrier implant 1102 (e.g., p_boron) underlying an edge 1104 of both gates 202, 204 nearest the PPD 210. The TG barrier implant 1102 is implanted proximate the PPD 210. In one embodiment, the TG barrier implant 1102 extends beneath the gates 202 and 204 by approximately 0.2 um. This barrier implant 1102 provides an improved barrier as charge collects within PPD 210. The addition of the barrier implant ensures collected signal electrons don't "leak" into the transfer gate regions and, thus, facilitates the use of shorter transfer gate lengths (<1 um). The low dose barrier implant 1102 does not significantly affect transfer gate inversion and CTE characteristics. The use of an MP implant layer in accordance with an embodiment of the invention is compatible with the use of a TG barrier implant.

FIG. 12 represents the potential conditions when signal charge collects in the PPD 210 for the NMOS MP pixel 1100 of FIG. 11. FIG. 13 represents potential conditions when charge is transferred for the NMOS MP pixel 1100 of FIG. 11. Initially, the epitaxial layer 206 and the transfer gates 202, 204 are held at a pinned potential equal to substrate potential while the sense node 224 (and the drain region 226) are held at about +3.3 volts. The barrier implant 1102 provides a pair of "shoulders" 1200 having a slightly lower potential than the rest of the transfer gate. In FIG. 12, signal electrons 'e-' collect in the PPD 210 that causes the potential of the PPD 210 to "fall" towards substrate potential. In FIG. 13, when a potential (e.g., about 2.0 V) is applied to the first transfer transfer gate 202, the electrons dump into the sense node 224, i.e., the charges move from region 1302 to the sense node 224.

Figure 14:
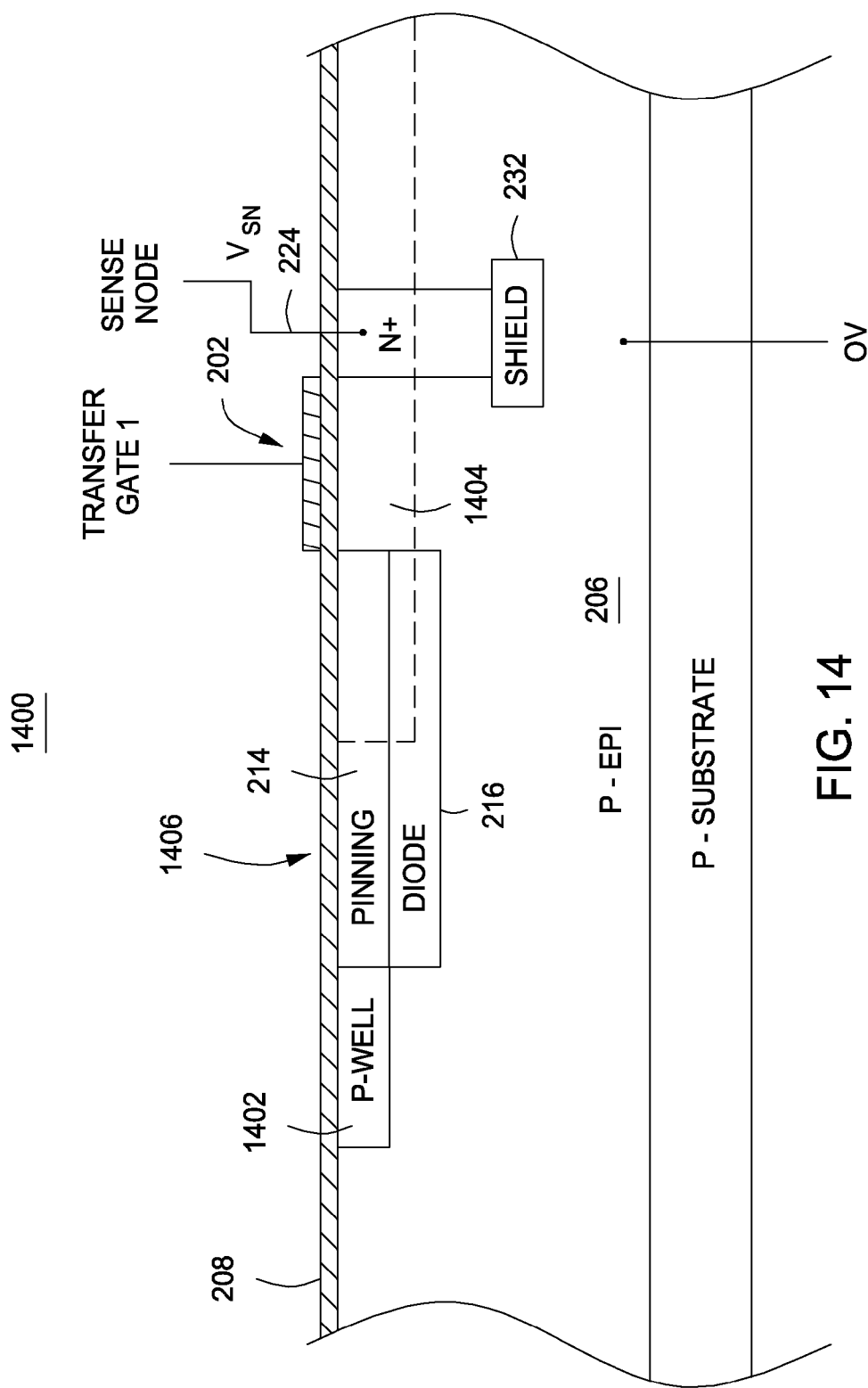
FIG. 14 is a cross-sectional view of a large, high-speed NMOS MP pixel where the MP implant only covers half of the PPD region nearest TG1 and sense node regions.

FIG. 14 is a cross-sectional view of a "large" NMOS MP pixel 1400 configured to have a very low dark current, according to an embodiment of the present invention. A "large" pixel can be defined as a pixel that is greater than about 16 um square where the amount of time necessary to charge transfer is greater than 1 us. Pixel 1400 comprises an MP implant layer 1404 that only includes a portion (e.g., about half) of the PPD 1406 on the transfer gate side. This partial implant increases the potential of the PPD 1406 and in turn, signal carriers migrate to this region instead of collecting in the entire PPD 1406 region. The remainder of pixel 1400 is the same as pixel 200 of FIG. 2.

Figure 15:
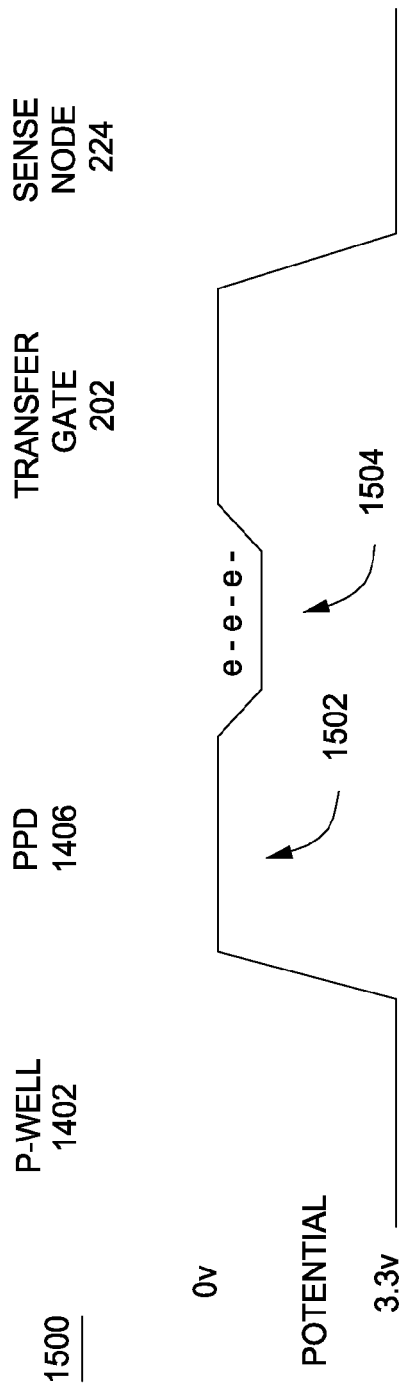
FIG. 15 illustrates a potential plot for a large high speed NMOS MP pixel of FIG. 14 operating in charge collection mode.
Figure 16:
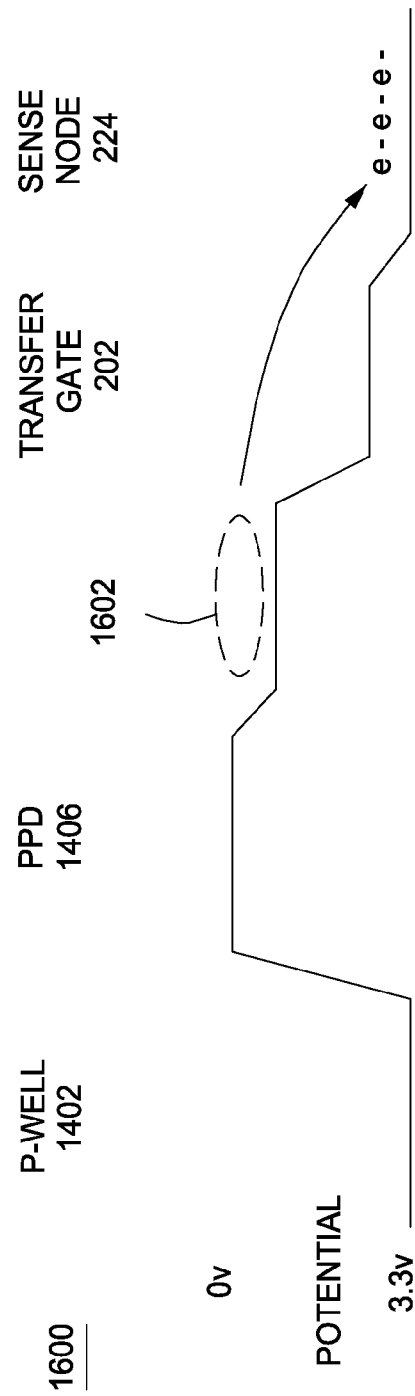
FIG. 16 illustrates a potential plot for a large high speed NMOS MP pixel of FIG. 14 operating in charge transfer mode.

FIG. 15 depicts a potential representation 1500 depicting the potential levels of pixel 1400 during charge collection. FIG. 16 depicts a potential representation 1600 depicting the potential levels of pixel 1400 during charge transfer. During charge collection, the sense node 224 is held at 3.3 v (for an n-type device) while the transfer gate 202 is inverted and pinned. Since the MP implant layer 1404 extends partially into the PPD 1406, two different potentials are created within the PPD 1406. The region 1502 without the MP implant layer 1404 has a slightly lower potential than the region 1504 compared to the MP implanted layer 1404; thus, causing all signal charge to move and collect in the PPD 210 toward the transfer gate 202 side into MP implant layer 1404.

As shown in FIG. 16, when the transfer gate is clocked "on", the charges move from region 1602 to the sense node 224. The proximity of the charges to the gate 202 facilities faster transfer time to the sense node 224, e.g., transfer speed typically increases by a factor of two.

Figure 17:
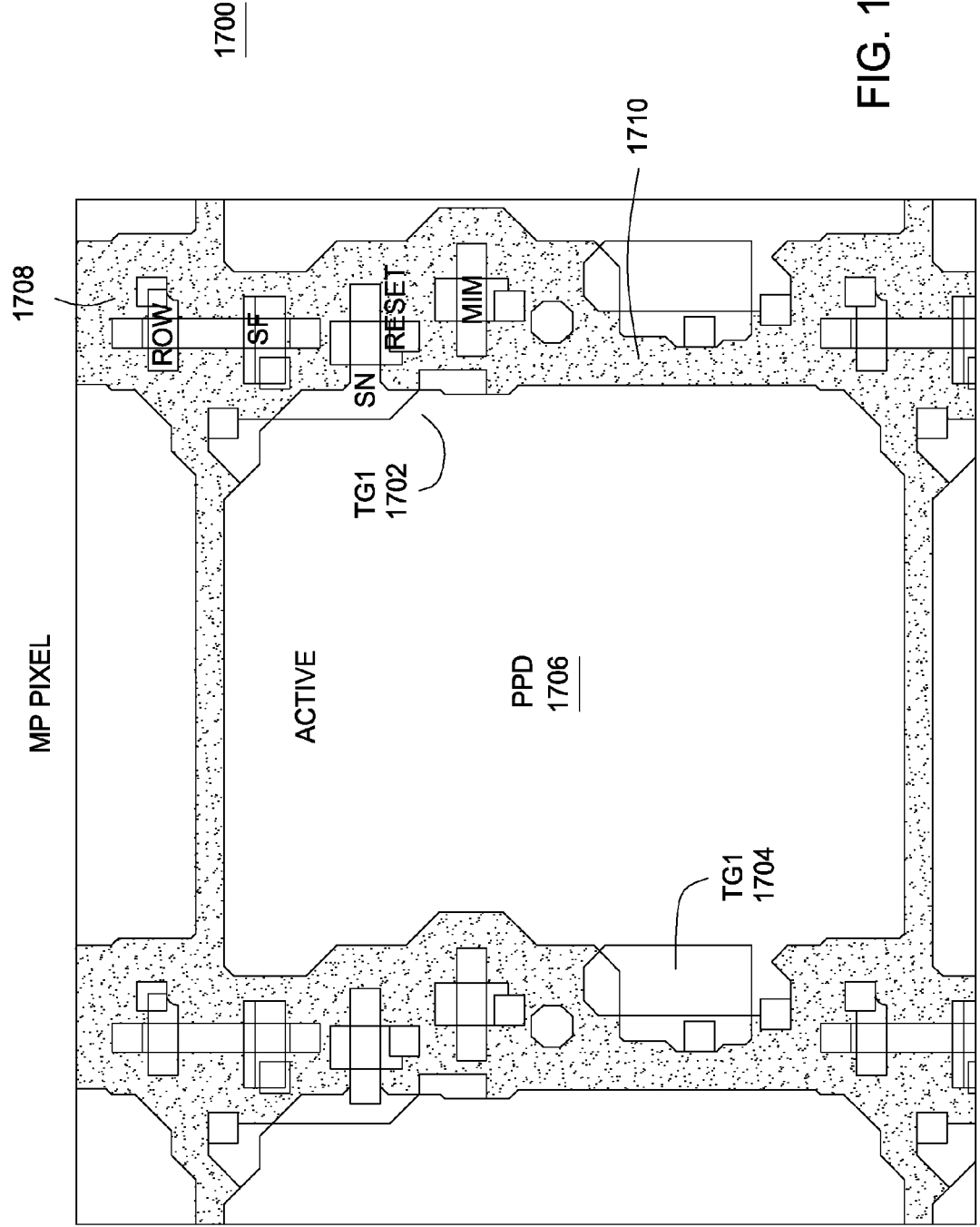
FIG. 17 depicts a top plan view of a CMOS MP pixel in accordance with one embodiment of the invention.

FIG. 17 depicts a top plan view of a CMOS MP pixel 1700 in accordance with one embodiment of the invention. The pixel 1700 may be NMOS or PMOS. The first and second transfer gates 1702 and 1704 are formed on each side of a PPD 1706, while the read MOSFETs 1708 are placed in a well 1710 circumscribing the PPD 1706. To form a complete sensor, the pixel 1700 is repeated in rows and columns to form an M×N pixel sensor, where M and N are integers.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A CMOS pixel, comprising:
   epitaxial silicon;
   at least one transfer gate formed overlying the epitaxial silicon;
   a pinned-photodiode formed in the epitaxial silicon adjacent to the at least one transfer gate;
   a multi-pinned (MP) implant layer implanted in the epitaxial silicon, wherein the pinned-photodiode comprises a portion of the MP implant layer and another portion of the MP implant layer is under the at least one transfer gate; and
   a sense node at least partially extending into the MP implant layer proximal to at least one of the at least one transfer gate.

2. The CMOS pixel of claim 1, wherein the MP implant layer facilitates passivating dark current in the MP implant layer beneath the at least one transfer gate when the at least one transfer gate is in an inverted state and promotes charge transfer conditions when in a transfer state.

3. The CMOS pixel of claim 1, wherein the MP implant layer is operable to pin the surface of the epitaxial silicon to a pinning potential established by the MP implant layer at multiple locations within the CMOS pixel.

4. The CMOS pixel of claim 3 wherein the multiple locations are at least the pinned photodiode and the at least one transfer gate.

5. The CMOS pixel of claim 1, wherein the at least one transfer gate comprises a first gate and a second gate and:
the second gate, proximate the pinned photodiode, has a portion of the MP implant layer beneath the second gate.

6. The CMOS pixel of claim 5, further comprising a drain formed at least partially extending into the MP implant layer proximal to the second gate.

7. The CMOS pixel of claim 5, further comprising a control circuit for applying a potential to at least one of the at least one transfer gates, wherein the potential drives at least one of the at least one transfer gates into inversion to passivate dark current.

8. The CMOS pixel of claim 7, wherein the potential is within about 0.5 volts of a potential of the epitaxial silicon.

9. A CMOS pixel, comprising:
epitaxial silicon;
at least one transfer gate formed overlying the epitaxial silicon;
a pinned-photodiode formed in the epitaxial silicon adjacent to the at least one transfer gate; and
a multi-pinned (MP) implant layer implanted in the epitaxial silicon, wherein the pinned-photodiode comprises a portion of the MP implant layer and another portion of the MP implant layer is under the at least one transfer gate, wherein the MP implant layer extends substantially across the entire CMOS pixel.

10. The CMOS pixel of claim 1 wherein the MP implant layer is implanted to a depth of about at least 450 Angstroms.

11. The CMOS pixel of claim 1 wherein the MP implant layer is implanted to a dose of about $1 \times 10^{12}$ ions/cm$^2$ using about an energy of 20 keV to about 30 keV.

12. The CMOS pixel of claim 1, further comprising a barrier implant formed in the epitaxial silicon, wherein the barrier implant extends at least partially underlying the at least one transfer gate for providing additional charge collection capability to the pinned photodiode.

13. The CMOS pixel of claim 1 wherein the MP implant layer extends only partially into the pinned photodiode and beneath the at least one transfer gate.

14. The CMOS pixel of claim 1 wherein the CMOS pixel is either a PMOS pixel or an NMOS pixel.

15. A method of fabricating a CMOS pixel comprising:
implanting a multi-pinned (MP) implant layer into epitaxial silicon, wherein the implanting of the MP implant layer occurs substantially across the entire CMOS pixel; and
forming a five transistor pinned-photodiode pixel into the epitaxial silicon, wherein the five transistor pinned-photodiode pixel comprises a pinned photo-diode and at least one transfer gate, wherein the MP implant layer provides a pinning potential to pin elements of the CMOS pixel at multiple locations, and wherein a portion of the MP implant layer is comprised in the pinned-photodiode and another portion of the MP implant layer is under the at least one transfer gate.

16. The method claim 15 wherein implanting of the MP implant layer is to a depth of about at least 450 Angstroms.

17. The method of claim 15 wherein implanting of the MP implant is to a dose of about $1 \times 10^{12}$ ions/cm$^2$ using about an energy of 20 keV to about 30 keV.

18. The method of claim 15 wherein the elements of the CMOS pixel comprise at least a pinned photodiode and a transfer gate, the MP implant layer facilitates passivating dark current in the MP implant layer beneath the transfer gate when the transfer gate is in an accumulation state and promotes charge transfer when the transfer gate is in a transfer state.

19. The method of claim 15 wherein the CMOS pixel is either a PMOS pixel or NMOS pixel.

20. The CMOS pixel of claim 1, wherein the pinned-photodiode comprises a pinning layer, and wherein the pinning layer is mixed with the portion of the MP implant layer comprised in the pinned-photodiode.

21. The CMOS pixel of claim 9, wherein the MP implant layer facilitates passivating dark current in the MP implant layer beneath the at least one transfer gate when the at least one transfer gate is in an inverted state and promotes charge transfer conditions when in a transfer state.

22. The CMOS pixel of claim 9, wherein the MP implant layer is operable to pin a surface of the epitaxial silicon to a pinning potential established by the MP implant layer at multiple locations within the CMOS pixel.

23. The CMOS pixel of claim 10, wherein the at least one transfer gate comprises a first gate and a second gate, and wherein the second gate, proximate the pinned photodiode, has a portion of the MP implant layer beneath the second gate.

24. The CMOS pixel of claim 23, further comprising a drain formed at least partially extending into the MP implant layer proximal to the second gate.

25. The CMOS pixel of claim 24, further comprising a control circuit for applying a potential to at least one of the at least one transfer gates, wherein the potential drives at least one of the at least one transfer gates into inversion to passivate dark current.

26. The CMOS pixel of claim 11, wherein the MP implant layer is implanted to a depth of about at least 450 Angstroms.

27. The CMOS pixel of claim 12, wherein the MP implant layer is implanted to a dose of about $1 \times 10^{12}$ ions/cm$^2$ using about an energy of 20 keV to about 30 keV.

28. The CMOS pixel of claim 13, further comprising a barrier implant formed in the epitaxial silicon, wherein the barrier implant extends at least partially underlying the at least one transfer gate for providing additional charge collection capability to the pinned photodiode.

29. The CMOS pixel of claim 14, wherein the pinned-photodiode comprises a pinning layer, and wherein the pinning layer is mixed with the portion of the MP implant layer comprised in the pinned-photodiode.

* * * * *